(12) United States Patent
Nelle et al.

(10) Patent No.: US 8,021,929 B2
(45) Date of Patent: Sep. 20, 2011

(54) APPARATUS AND METHOD CONFIGURED TO LOWER THERMAL STRESSES

(75) Inventors: Peter Nelle, Munich (DE); Matthias Stecher, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/975,825

(22) Filed: Dec. 22, 2010

(65) Prior Publication Data
US 2011/0089545 A1    Apr. 21, 2011

Related U.S. Application Data

(63) Continuation of application No. 11/925,268, filed on Oct. 26, 2007, now Pat. No. 7,888,782.

(51) Int. Cl.
*H01L 21/00*    (2006.01)
(52) U.S. Cl. .......... 438/123; 257/669; 257/E23.019
(58) Field of Classification Search .......... 438/123; 257/669, E23.019
See application file for complete search history.

(56) References Cited

U.S. PATENT DOCUMENTS

| | | | |
|---|---|---|---|
| 5,025,114 A | 6/1991 | Braden | |
| 5,386,141 A | 1/1995 | Liang et al. | |
| 5,506,446 A | 4/1996 | Hoffman | |
| 7,061,085 B2 | 6/2006 | Moxham | |

OTHER PUBLICATIONS

Callister, Jr., William D. Materials Science and Engineering, 1994, John Wiley & Sons, Inc. Third Edition, p. 122.
"Elastoplastic Creep Analysis of Thermal Stress and Strain in Aluminum Interconnects of LSIs", Kazunori Hiraoka, Electronics and Communication in Japan, Part 2, vol. 77, No. 3, 1994.
"Mechanical Properties of Electroplated Copper Thin Films", R. Spolenak, et al., Materials Research Society Symp. Proc. vol. 594, 2000 Materials Research Society.
"Mechanical Stress as a Function of Temperature in Aluminum Films", Donald S. Gardner, et al., IEEE Transactions on Electronic Devices, vol. 35, No. 12, Dec. 1988.
"Stress evolution in passivated thin films of Cu on silica substrates", Y-L. Shen, et al., J. Materials Research Society, vol. 13, No. 7, Jul. 1998.
"Thermo-Mechanical Design of Flip Chips for Harsh Environments", Stelios Michaelides, et al., ICEMCM '96 Proceedings, International Conference of Multichip Modules, Apr. 17-19, 1996.
Office Action mailed May 15, 2009 in U.S. Appl. No. 11/925,268.
Office Action mailed Sep. 11, 2009 in U.S. Appl. No. 11/925,268.
Office Action mailed Feb. 19, 2010 in U.S. Appl. No. 11/925,268.

*Primary Examiner* — Jenny L. Wagner
(74) *Attorney, Agent, or Firm* — Dicke, Billig & Czaja, PLLC

(57) ABSTRACT

An apparatus and a method configured to lower thermal stress is disclosed. One embodiment provides a semiconductor chip, a lead frame and a layer structure. The layer structure includes at least a diffusion solder layer and a buffer layer. The layer structure is arranged between the semiconductor chip and the lead frame. The buffer layer includes a material, which is soft in comparison to a material of the diffusion solder layer, and includes a layer thickness such that thermal stresses in the semiconductor chip remain below a predetermined value during temperature fluctuations within a temperature range.

14 Claims, 5 Drawing Sheets

APPARATUS AND METHOD CONFIGURED TO LOWER THERMAL STRESSES

CROSS-REFERENCE TO RELATED APPLICATIONS

This Utility Patent Application is a continuation application of U.S. application Ser. No. 11/925,268, filed Oct. 26, 2007, which is incorporated herein by reference.

BACKGROUND

The present invention relates to an apparatus and a method, including to limit thermal stresses between a semiconductor chip and a lead frame.

Power semiconductors are used, e.g., in automobile and industrial applications. In these application, a low-stress connection between a semiconductor chip and the underlying lead frame is of great importance. Thermal tensions or stress can occur due to a fast heating and cooling of the chip. Releasing these thermal tensions or stress can significantly increase the life span of a device.

SUMMARY

Embodiments relate to an apparatus including a semiconductor chip, a lead frame and a layer structure. In one embodiment, the layer structure includes at least a diffusion solder layer and a buffer layer, wherein the layer structure is arranged between the semiconductor chip and the lead frame. The buffer layer includes a material, which is soft in comparison to a material of the diffusion solder layer, and includes a layer thickness such that thermal stresses in the semiconductor chip remain below a predetermined value during temperature fluctuations within a temperature range.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

Figure 1A:
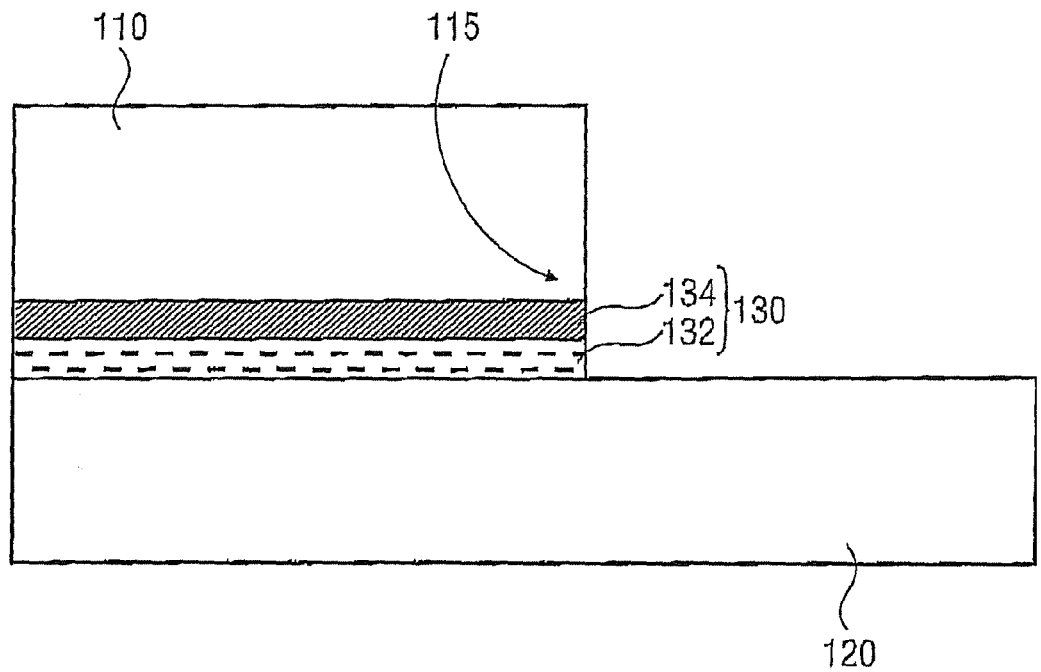
FIGS. 1a,b illustrate cross-sectional views of a layer structure arranged between a semiconductor chip and a lead frame according to an embodiment of the present invention.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

In the power electronics and, in one embodiment, in the semiconductor power electronics used in automobile and industrial applications, occurs often a significant heating of a semiconductor chips (which are fabricated on a silicon basis, for example). To guarantee a flawless functionality of the semiconductor chips, it is especially important to dissipate the generated heat as efficiently as possible and to a sufficient extent. This problem is aggravated by the fact that the heat is generated in a region, which becomes increasingly smaller, yet in spite of that, the optimum possible de-heating should be ensured at the same time. The increased power density and heat generation are a result of progressive integration densities and rising demands in the chip fabrication for automobile and industrial applications. The problem can be tackled only by ensuring optimized heat dissipation. This can be achieved, for example, by thinner chips in combination with a solder connection having a good thermal conductivity. However, this is not present in common soft solder connections based on a lead-tin compound PbSn or a silver-tin-copper compound AgSn(Cu). These solders are deposited with a standard thickness, which can range between 20 and 100 µm, for example.

Thin diffusion solder connections provide a remedy to efficiently dissipate generated heat within a chip. These thin diffusion solder connections can include gold-tin (AuSn) and/or copper-tin compounds (CuSn), for example. These compounds have the advantage that after achieving the soldering temperature, an immediate hardening takes place and, furthermore, a solid connection which illustrates a good thermal conductivity is established. These diffusion solder materials are also particularly suitable for a semiconductor chip on a silicon basis and a lead frame on a copper basis, and, thus, for materials frequently used for power devices. However, these materials are not optimum either and lead to difficulties as well. The difficulties arising in this context include, for example, the different thermal extension coefficients of copper and silicon, which, especially after cooling to room temperature, lead to strong thermo-mechanical stresses at the edge of the silicon chip. In the worst case, these stresses can lead to cracks and breaks in the silicon, and, thus, impair the functioning of the semiconductor chip or, in the worst case, destroy the semiconductor chip.

A conventional soft soldering or a low temperature soldering process based typically on a solid-liquid inter-diffusion of two metals, which permits the formation of connections which are stable up to a temperature that is much higher than the bonding temperature. It follows that, during bonding, an eutectic alloy is formed whose melting point after the joining process will be higher than the melting points of the individual components prior to the joining process. Hence, a connection is formed, which is irreversible insofar as it is stable with respect to the conditions under which it has been previously established. Examples for combinations of metals, which can be used for electrical and mechanical connections, are copper and tin, or gold and titanium, for the respective front and back contacts.

In general, soft solder are alloys, which dependent on the application include materials as for example lead, tin, silver and copper. The soft solder material connects the appropriate metals by covering in a liquid phase the surface of the metals. Soft solder based on tin are the most commonly used soft solder material, which are, in alloys with lead and sometimes with a part of iron, antimony, copper or nickel. The melting temperature for tin soldering materials are typically around 330° Celsius, and in case of heating up the solder materials, it becomes soft and finally a transition into a liquid state occurs.

In prior methods using soft solder connections (soft soldering); the semiconductor chips include, at the backside, a stack of the following layers:

(A) A thin aluminum layer for a good thermal and adhesive contact to silicon. Thus, the aluminum layer could be chosen to be under 500 nm;

(B) a thin titanium layer as a barrier against the solder material;

(C) nickel (Ni), nickel vanadium (NiV) or a combination thereof to achieve an improved solder wetting; and (D) silver or gold to improve a connection with the soft solder material.

In other standard soldering methods, a thick layer of a lead-tin-silver (PbSnAg) compound and also of a tin-silver (copper) compound was employed, which, however, displays significant disadvantages both due to its thicknesses and its limited thermal conductivity. Furthermore, in the field of single-semiconductors, also gold-tin solder connections are applied in very small chips and very thin lead frames.

The conventional standard solders, such as lead-tin-silver, guarantee a mechanical buffering effect due to a degradation of thermo-mechanical stresses at the edge of the semiconductor device, however, they illustrate very poor thermal conductivity, and their electrical conductivity, too, is insufficient. Therefore, there is a need to generate, between a semiconductor device and a lead frame, a solder connection having a long life span and further including ductile properties. Thus, in the case of an overstressing, the solder connection could react with a plastic deformation, which leads to a release of thermo-mechanical stresses. In an ideal case the deformation would be elastic, so that after a stress release the original chip/lead frame connection is recovered. In order to reach this ideal case the buffer layer may include a layer thickness of up to 50 μm. At the same time, the solder connection should include a high degree of thermal conductivity and electrical conductivity.

One or more embodiments provide a layer structure arranged between a semiconductor chip and a lead frame and at least one diffusion solder layer and a buffer layer of a material which is soft in comparison to a material of the diffusion solder layer. In this embodiment, the buffer layer includes a minimum layer thickness, which is chosen such that thermomechanical stresses in the semiconductor chip are below 6 GPa (GigaPascal) or below 500 MPa (MegaPascal) or below 300 MPa or below 100 MPa or below 50 MPa during heating or cooling within a temperature range from −55° C. to 320° C. An upper stress limit includes 80 GPa or 60 GPa. Thus, one or more embodiments include a thick metal layer, which is ductile (buffer layer), too, but include a very good electrical conductivity. The buffer layer may include aluminum (or aluminum/magnesium), for example, and may be arranged between the semiconductor chip (silicon, for example) and the solder layer.

In further embodiments, the buffer layer includes a layer thickness of at least 500 nm or more than 1 μm or ca. 2 μm, whereby a flow stress of approximately 300 MPa can be reduced down to 100 MPa. This reduction of the flow stress is accomplished without crucially impairing the electrical conductivity or the thermal conductivity. At the same time, this significantly increases the mechanical buffering effect.

Thus, one or more embodiments include a number of advantages. On the one hand, this involves an improved thermal and electrical conductivity between a semiconductor chip and, for example, a copper lead frame, with a concurrent good mechanical buffering effect. Thereby, cracks in the semiconductor chip including, for example, silicon can be avoided especially at the edges (chip edges). In comparison to standard solders, this buffering effect is established by a thick metal layer having a good thermal and electrical conductivity and including aluminum, for example. The exemplary aluminum layer has a low yield stress and a high plasticity and a low Young's modulus—yet in spite of this, it is very resistant to cracks. Thus, it can be ensured that even with a frequent thermal stress, a stable and functional connection is maintained.

However, to achieve this effect, a minimum layer thickness of the exemplary aluminum layer is needed. A layer thickness below 500 nm does not show a significant progress in the avoidance of mechanical stresses due to temperature fluctuation. For a hard diffusion solder connection, a layer thickness of at least 0.8 μm, for example, may be used for the aluminum layer. With this layer thickness, the stress profile within the semiconductor device displays a significantly different behavior, and this is why embodiments use a layer thickness of more than 0.8 μm or, even better, of approximately 2 μm or within a range between 1.8 μm and 2.5 μm or within a range between 1.8 μm and 50 μm. In case the buffer layer includes different materials, the optimized thickness (to ensure a sufficient stress release) can be different, too.

One embodiment includes depositing a metal buffer layer between an exemplary silicon layer and a diffusion solder layer, wherein the metal buffer layer may also include a multiple stack. The multiple stacks may include several different ductile metal layers, for example, wherein the layer contacting the silicon does not necessarily need to be a ductile layer. Another layer of the stack can also compensate the occurring stresses by a plastic deformation.

FIG. 1a illustrates a cross-sectional view through a semiconductor chip 110 with an edge 115 and a lead frame 120, which are separated from each other by a layer structure 130. The layer structure 130 includes a diffusion solder layer 132 and a buffer layer 134, for example. The diffusion solder layer 132 may include a gold-tin alloy, for example, or may include a copper-tin alloy. The semiconductor chip 110 may include silicon, for example, and may include an active or passive device. The lead frame 120 can include copper, for example. The buffer layer 134 may also include several layers (a layer sequence), at least one layer of the layer sequence including a plastically deformable material and being formed with a sufficient layer thickness to limit or to lead-off the stresses, which are caused, for example, by (rapid) temperature fluctuations.

Thus, FIG. 1 illustrates how a release of mechanical stresses at the silicon chip edge 115 can be achieved by an including a ductile buffering layer 134 with a good electrical conductivity between the exemplary silicon chip 110 and the diffusion solder layer 132.

Figure 1B:
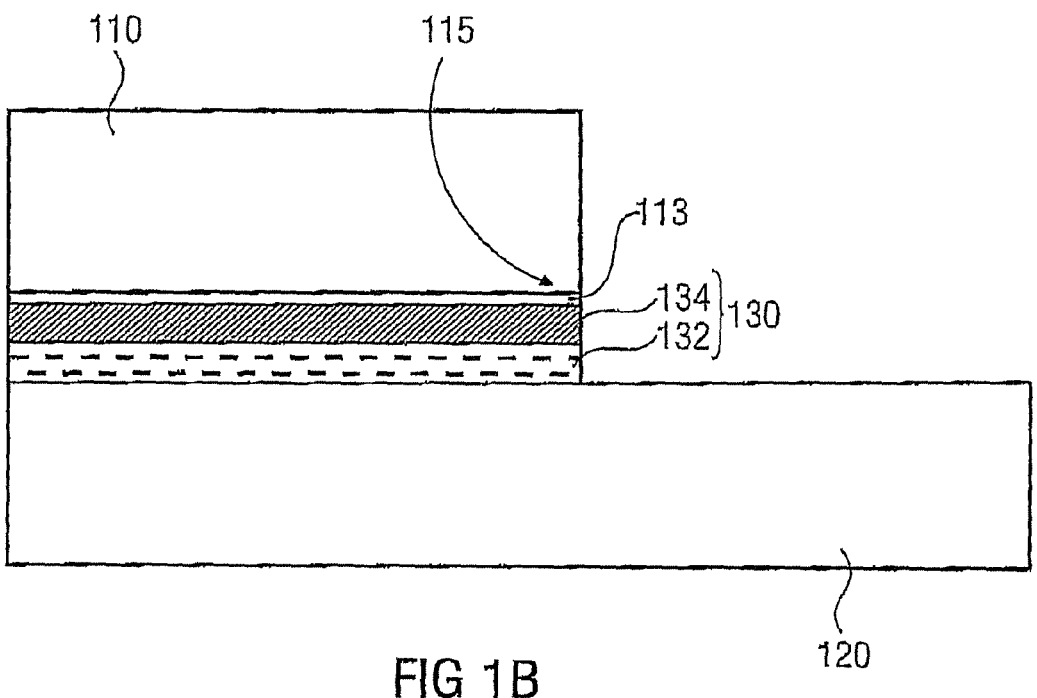

FIG. 1b illustrates a further cross-sectional view through the semiconductor chip 110 with the edge 115 and the lead frame 120, which are separated from each other by the layer structure 130. The layer structure 130 includes the diffusion solder layer 132 and the buffer layer 134, for example. In addition, the layer structure 130 comprises an intermediate layer 113 arranged between the buffer layer 134 and the semiconductor chip 110, wherein the intermediate layer 113 is configured to lower the stress between the semiconductor chip 110 and the buffer layer 134.

Figure 2:
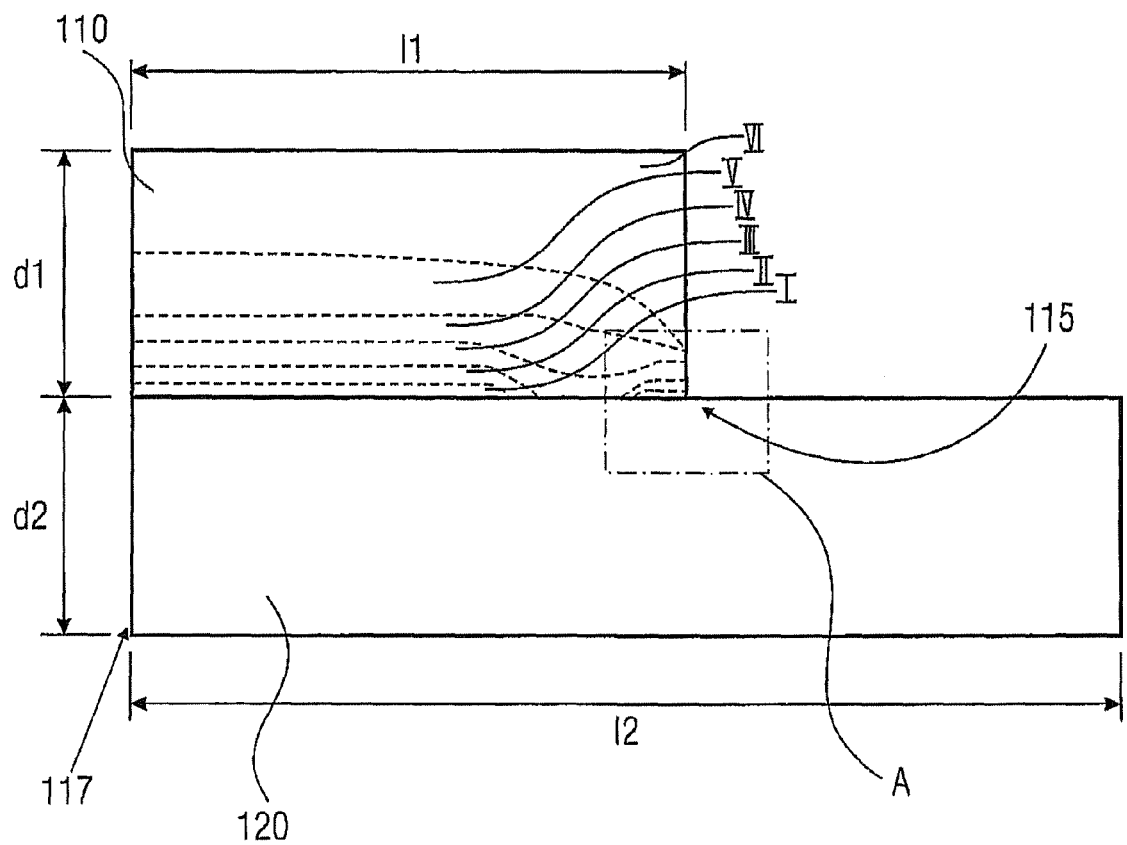
FIG. 2 illustrates the mechanical stress within the chip without the layer structure.

FIG. 2 also illustrates the semiconductor chip 110 on the lead frame 120, wherein, however, no buffer layer 134 is formed and wherein the corresponding mechanical stresses in the exemplary silicon chip 110 after a heating to 320° C. (for diffusion soldering, for example) and a cooling down to −55° C. are illustrated. The mechanical stress profiles were generated by a simulation, the exemplary silicon chip 110 being deposited on an exemplary copper lead frame 120.

The stress profiles include several regions of differently strong stresses. The single regions relate to the following approximated stresses occurring in the regions of the silicon chip 110:

a region I: ca. 0.7 GPa,
a region II: ca. 0.6 GPa,
a region III: ca. 0.5 GPa,
a region IV: ca. 0.4 GPa,
a region V: ca. 0.3 GPa and
a region VI: ca. 0.2 GPa.

As can be seen in FIG. 2, the first region I is formed at the edge 115 of the exemplary silicon chip 110 as well as the part of the chip 110 adjacent to the lead frame 120. With an increasing distance to the lead frame 120 follow: the second region II, the third region III, the fourth region IV, the fifth region V and the sixth region VI. The boundaries between the single regions are only approximately indicated by dashed lines, wherein, in general, a continuous transition of the stress profiles will occur, so that, in general, there will be no suddenly occurring increase in the stress in the semiconductor chip 110.

Silicon chip 110 includes a length l1 and a height d1, for example, a third extension (not illustrated in the FIG. 2) extending perpendicular to the drawing plane. The lead frame 120 includes a length l2 and a height d2, a further direction not being illustrated either in the figure extends perpendicular to the drawing plane. In the simulation, as underlying FIG. 2, the following example dimensions are used as a basis: l1~ca. 2 mm, l2~ca. 4 mm, d1~ca. 250 μm and d2~ca. 250 μm. A side 117 opposing the chip edge 115 in general does not represent a chip boundary, but can be an imaginary plane, for example, such that the region, as is illustrated in FIG. 2, is continued in a reflective symmetric way across the side 117.

Figure 3:
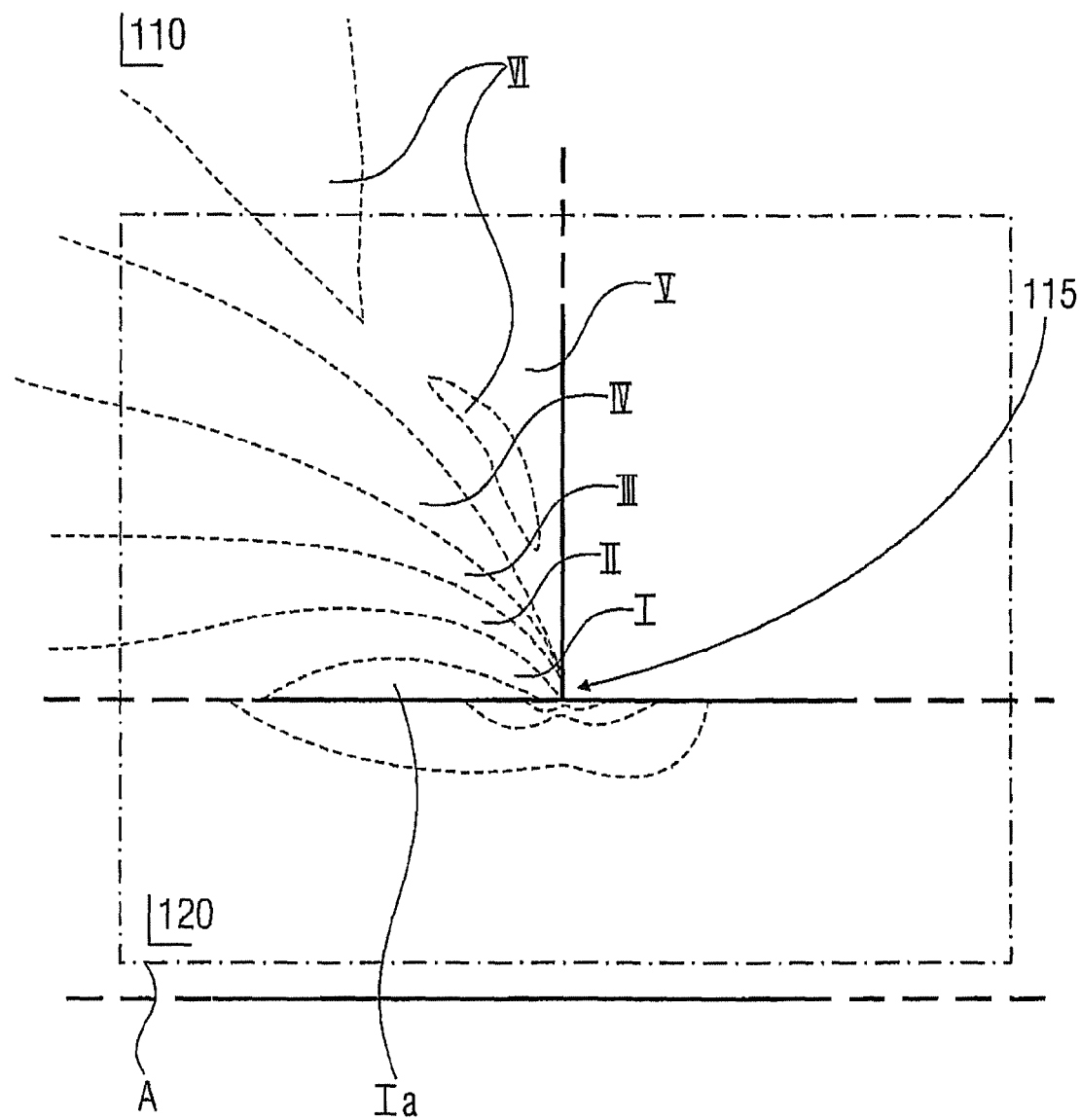
FIG. 3 illustrates the mechanical stress within an edge of the chip.

FIG. 3 illustrates the section A marked in FIG. 2 in an enlarged form. Thus, the stress profile within the exemplary silicon chip 110 near the edge 115 is illustrated more clearly. Therefore, FIG. 3, in turn, illustrates the mechanical stress profile in the exemplary silicon chip 110 after a heating to 320° C. and a cooling down to −55° C. The silicon chip 110 is deposited on a copper lead frame 120, without a buffer layer 134 being arranged between both layers. The mechanical stress profile at the chip edge 115 after diffusion-soldering the silicon chip 110 onto the copper lead frame 120 was, in this context, determined by a principal two-dimensional simulation. In this simulation, an infinitesimal thin solder layer 132 was assumed.

Thus, FIG. 3 illustrates the accurate profile of the mechanical stress near the edge 115 in an enlarged illustration of the edge region 115. It is apparent that the regions I to VI run towards the edge 115 and that a region of very high stresses forms near the edge 115. The regions of increased stresses are near the edge 115 and include the first region I, the second region II and the third region III, the stress increasing towards the chip edge 115. The region of very high stresses includes, for example, a region Ia forming in close proximity to the chip edge 115 and including up to 10 GPa, for example. These high stresses can lead to cracks in the silicon chip 110, which, in any case, should be avoided. Furthermore, it is apparent in FIG. 3 that regions of increased stresses form also in the copper lead frame 120.

Figure 4:
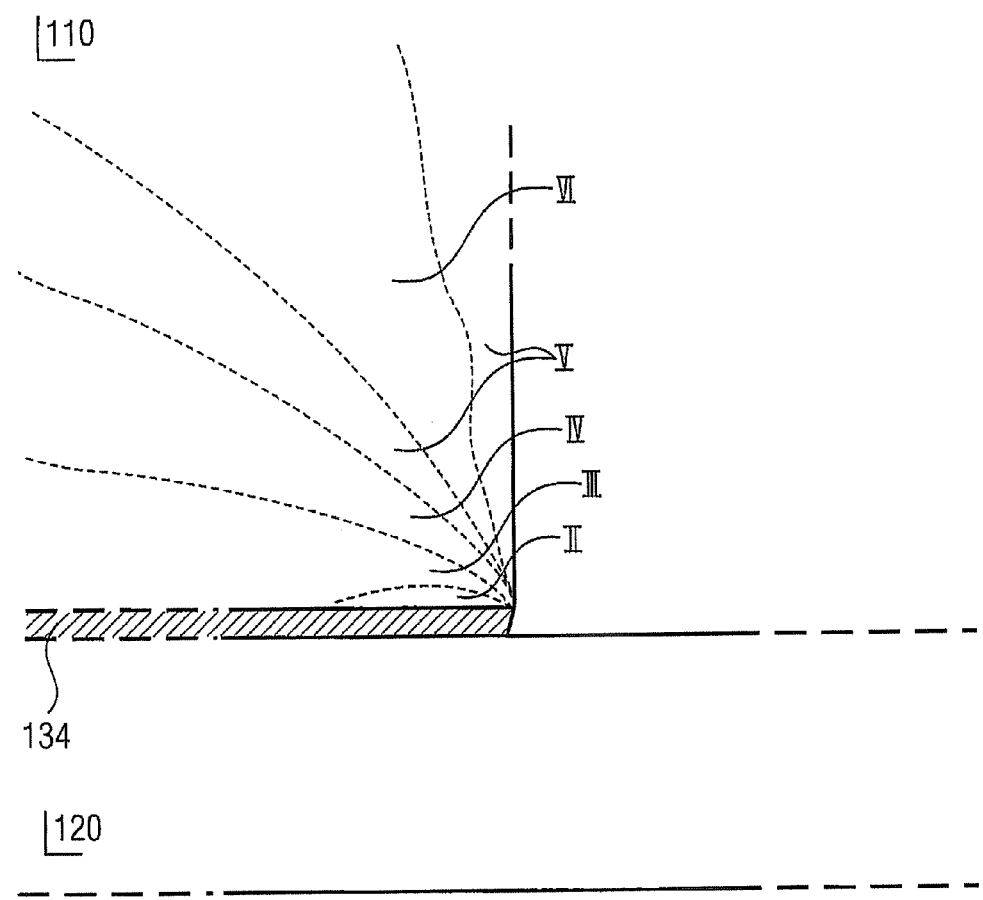
FIG. 4 illustrates the mechanical stress within the chip if a thin intermediate layer is arranged between the chip and the lead frame.

FIG. 4 illustrates the same section as FIG. 3, however, in the embodiment of FIG. 4, a buffer layer 134 is arranged between the silicon chip 110 and the copper lead frame. The stress profiles can be obtained by a two-dimensional simulation, wherein it is assumed that the buffer layer 134 includes an aluminum layer of a thickness of 0.5 μm and that the stresses were obtained by a cooling down from 320° C. down to −55° C.

FIG. 4 illustrates already the effect that the stresses near the chip edge 115 were released (or lead off) and yield a significant reduction of the edge stress. The highest stress occurring in the embodiment of FIG. 4, includes a stress of approximately 0.6 GPa (the second region II) and, with increasing distance from the lead frame 120, it is quickly released in the exemplary silicon chip 110. In this embodiment, too, it is illustrated that the regions of different stresses converge to the chip edge 115, where the highest stress occurs.

Figure 5:
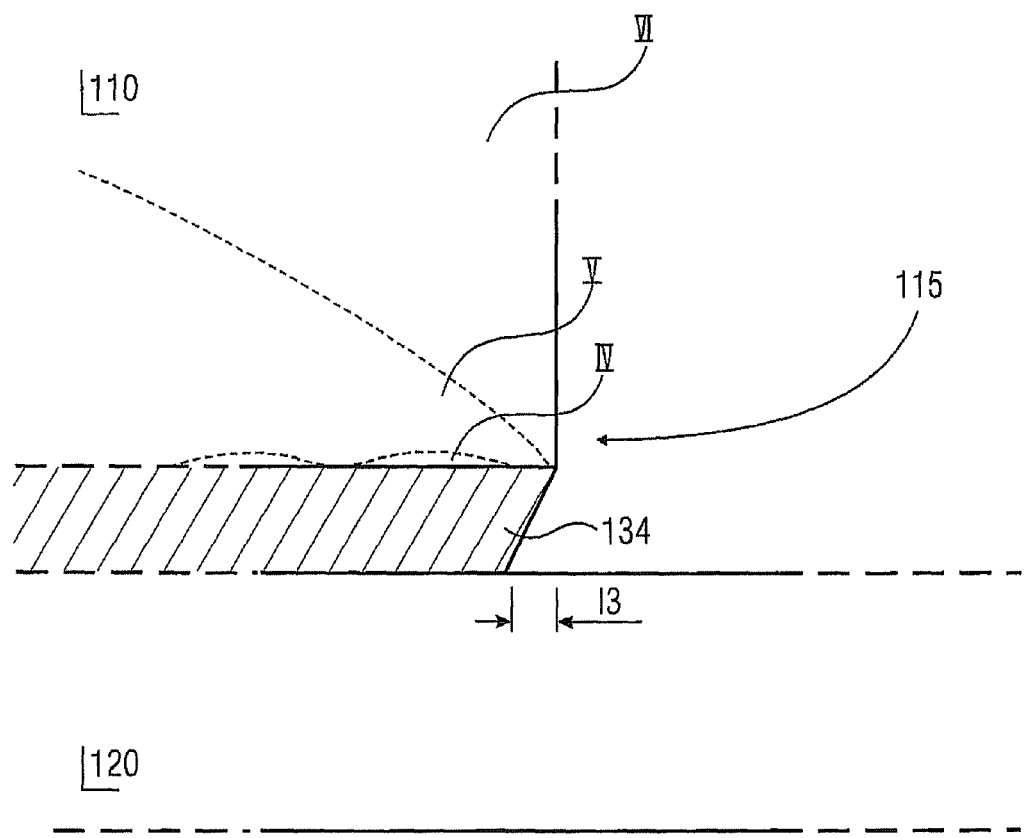
FIG. 5 illustrates the mechanical stress with a layer structure according to an embodiment of the present invention arranged between the chip and the lead frame.

FIG. 5 illustrates a further embodiment, wherein the layer thickness of the buffer layer 134 was increased to a thickness of 2 μm, and wherein the buffer layer 134 includes aluminum. As is illustrated by this two-dimensional simulation, the stress profile could thereby be significantly released, so that the highest stress occurring near the edge 115 is approximately 0.3 GPa (corresponding to the fourth region IV) in this embodiment. It is also illustrated that the buffer layer 134 compensates the occurring stresses by a plastic deformation, which is depicted by a relative shift 13 of the chip 110 with respect to the lead frame 120.

FIG. 5 further illustrates that substantially only two regions still occur within the silicon chip 110, the fifth region V and the sixth region VI, which is achieved by a further significant reduction of the edge stress by increasing the aluminum buffer layer 134 to 2 μm. As in the Figures illustrated in the foregoing it is assumed that the mechanical stresses in the silicon chip 110 are formed by a heating to 320° C. (e.g., as a result of the diffusion soldering process) and a subsequent cooling down to −55° C.

Thus, if the layer thickness of the aluminum layer 134 is used as in conventional methods (typically 500 nm), there is no sufficient plastic deformation yet and hence the desired effect of reducing the stress in the chip edge 115 does not yet occur. When using aluminum starting from a layer thickness of approximately 1 μm the desired effect occurs, and it is sufficiently formed with an approximate layer thickness of 2 μm.

In one or more embodiments, initially an aluminum layer or a gold-tin compound, which in turn is soldered on the thick copper plate (lead frame 120), is deposited onto the exemplary silicon chip 110. The lead frame 120 can later be further soldered, and at the same time, it establishes a good thermal contact. For example, a mounting on a PCB board (PCB=printed circuit board) can be made. For example, the diffusion solder connection can be made such that initially, e.g., gold and tin atoms are deposited in an amorphous manner by using sputtering. In the soldering process a diffusion into the copper (of the lead frame 120) occurs under increased temperature and/or pressure. The sputtering can be made by use of argon atoms, for example. The mounting pressure used in the diffusion soldering process leads to a transformation process and a eutectic connection (mixed phase with in-diffusing copper). As a result, the solder layer includes a higher melting temperature than the original materials, and, thus, becomes thermally very stable.

In further embodiments alternative materials are used. For example, instead of a copper lead frame, molybdenum can also be used—or copper alloys can be present. As an alternative to an aluminum layer, a layer stack can be used including, apart from aluminum, titanium, tantalum or nickel or magnesium. The aluminum may be deposited by sputtering, too.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An apparatus configured for releasing a thermal stress within a semiconductor chip, comprising:
    a first means comprising a semiconductor chip;
    a second means for framing the first means; and
    a third means for connecting the first and second means, the third means comprising a diffusion solder layer and a buffer layer, the buffer layer comprising a material, which is ductile and soft in comparison to a material of the diffusion solder layer,
    wherein the third means is arranged between the first means and the second means, and wherein the buffer layer comprises a layer thickness that is greater than 500 nm and such that thermal stresses in the first means remain below a predetermined value during temperature fluctuations within a temperature range.

2. The apparatus of claim 1, wherein the predetermined values comprises 6 GPa or 50 MPa and the temperature range is between minus 55° C. and 320° C.

3. The apparatus of claim 1, wherein the buffer layer comprises a layer thickness between 500 nm and 50 μm.

4. The apparatus of claim 1, wherein the buffer layer comprises a layer thickness between 800 nm and 2.5 μm.

5. A method for manufacturing a device, comprising:
    providing a lead frame;
    depositing a diffusion solder layer onto the lead frame;
    depositing a buffer layer onto the diffusion solder layer, the buffer layer comprising a ductile material, which is soft in comparison to a material of the diffusion solder layer, the buffer layer and the diffusion solder layer forming a layer structure;
    arranging a semiconductor chip onto the layer structure; and
    diffusion soldering the semiconductor chip onto the lead frame by heating and subsequent cooling down,
    wherein the buffer layer comprises a thickness such that thermal stresses in the semiconductor chip remain below a predetermined value during the heating and the subsequent cooling down.

6. The method of claim 5, wherein the deposition of the buffer layer is performed such that the layer thickness of the buffer layer is at least 0.8 μm or more than 1 μm.

7. The method of claim 5, wherein the deposition of the buffer layer is performed such that the buffer layer comprises aluminum or aluminum magnesium.

8. The method of claim 5, wherein the deposition of the buffer layer is performed such that the buffer layer comprises a layer thickness that is greater than 500 nm.

9. The method of claim 8, wherein the deposition of the buffer layer is performed such that the buffer layer comprises a predetermined layer thickness of more than 1 μm and the buffer layer comprises aluminum.

10. The method of claim 8, wherein the deposition of the buffer layer is performed such that the buffer layer comprises a predetermined layer thickness between 1.8 and 50 μm.

11. The method of claim 5, wherein the device comprises an integrated circuit.

12. An apparatus configured for releasing a thermal stress within a semiconductor chip, comprising:
    a first means comprising a semiconductor chip;
    a second means comprising a lead frame; and
    a third means for connecting the first and second means, the third means comprising a diffusion solder layer and a buffer layer, the buffer layer comprising a material, which is ductile and soft in comparison to a material of the diffusion solder layer,
    wherein the third means is arranged between the first means and the second means, and wherein the buffer layer comprises a layer thickness such that thermal stresses in the first means remain below a predetermined value during temperature fluctuations within a temperature range, and
    wherein the semiconductor chip and the lead frame are thermally and electrically connected via the diffusion solder layer and the buffer layer, the diffusion solder layer and the buffer layer directly contact each other and the lead frame has metal atoms of the diffusion solder layer diffused into itself.

13. The apparatus of claim 12, wherein the third means consists of the diffusion solder layer and the buffer layer.

14. The apparatus of claim 12, wherein the third means forms a diffusion solder connection.

* * * * *